(12) United States Patent
Fu et al.

(10) Patent No.: US 11,846,744 B2
(45) Date of Patent: Dec. 19, 2023

(54) ELECTRICAL PROSPECTING SIGNAL TRANSMISSION DEVICE CAPABLE OF SUPPRESSING ELECTROMAGNETIC COUPLING INTERFERENCE AND ELECTRICAL PROSPECTING SIGNAL TRANSMISSION METHOD USING SAME

(71) Applicant: HUNAN UNIVERSITY OF SCIENCE AND TECHNOLOGY, Xiangtan (CN)

(72) Inventors: Guohong Fu, Xiangtan (CN); Hui Cheng, Xiangtan (CN); Songyuan Fu, Xiangtan (CN); Xiangqin Zhong, Xiangtan (CN)

(73) Assignee: HUNAN UNIVERSITY OF SCIENCE AND TECHNOLOGY, Xiangtan (CN)

( * ) Notice: Subject to any disclaimer, the term of this patent is extended or adjusted under 35 U.S.C. 154(b) by 168 days.

(21) Appl. No.: 17/687,192

(22) Filed: Mar. 4, 2022

(65) Prior Publication Data
US 2022/0187488 A1 Jun. 16, 2022

Related U.S. Application Data

(63) Continuation of application No. PCT/CN2021/084286, filed on Mar. 31, 2021.

(30) Foreign Application Priority Data

Mar. 31, 2020 (CN) .......................... 202010242180.X

(51) Int. Cl.
*G01V 3/00* (2006.01)
*G01V 3/08* (2006.01)
(Continued)

(52) U.S. Cl.
CPC .............. *G01V 3/083* (2013.01); *G01V 3/12* (2013.01); *G01R 29/26* (2013.01); *G01V 2003/086* (2013.01)

(58) Field of Classification Search
CPC .......... G01R 29/26; G01V 3/02; G01V 3/083; G01V 3/12; G01V 2003/086
See application file for complete search history.

(56) References Cited

U.S. PATENT DOCUMENTS 5,303,415 A * 4/1994 Takayama ............ H04B 1/1027
455/296
5,555,552 A * 9/1996 Kawaguchi ....... H04M 1/72505
455/226.1
(Continued)

FOREIGN PATENT DOCUMENTS

CN 1773311 A 5/2006
CN 1821809 A 8/2006
(Continued)

OTHER PUBLICATIONS

Fu Guohong et al. Decoupling model and simulation analysis from signal transmitters in frequency domain IP. Progress in Geophysics. vol. 31,No. 04,Aug. 15, 2016, pp. 1569-1574.

*Primary Examiner* — Thang X Le

(57) ABSTRACT

An electrical prospecting signal transmission device capable of suppressing electromagnetic coupling interference, including a rectangular wave signal source, an output circuit for supplying power to the ground and a plurality of transmission channels. Each of the plurality of transmission channels includes an isolated driving circuit, a low-pass filter circuit and a power amplification circuit connected sequentially in series. The rectangular wave signal source is configured to generate a rectangular wave or a composite rectangular wave. A signal output terminal of the rectangular wave signal source is connected to an input terminal of the
(Continued)

isolated driving circuit, and an output terminal of the power amplification circuit is connected to the output circuit to supply power to the ground.

9 Claims, 4 Drawing Sheets

(51) Int. Cl.
 *G01V 3/12* (2006.01)
 *G01R 29/26* (2006.01)

(56) References Cited

U.S. PATENT DOCUMENTS

| | | | |
|---|---|---|---|
| 6,188,221 B1* | 2/2001 | Van de Kop | G01V 3/12 |
| | | | 324/334 |
| 7,948,236 B1 | 5/2011 | Olsson et al. | |
| 2012/0049869 A1* | 3/2012 | Kremin | G06F 3/0446 |
| | | | 324/658 |

FOREIGN PATENT DOCUMENTS

| | | |
|---|---|---|
| CN | 100520301 C | 7/2009 |
| CN | 102053278 A | 5/2011 |
| CN | 203069796 U | 7/2013 |
| CN | 203069797 U | 7/2013 |
| CN | 104407389 A | 3/2015 |
| CN | 111290026 A | 6/2020 |
| CN | 111323827 A | 6/2020 |
| CN | 211375079 U | 8/2020 |
| CN | 211402772 U | 9/2020 |
| SU | 890331 A1 | 12/1981 |
| WO | 2017083428 A1 | 5/2017 |

\* cited by examiner

ELECTRICAL PROSPECTING SIGNAL TRANSMISSION DEVICE CAPABLE OF SUPPRESSING ELECTROMAGNETIC COUPLING INTERFERENCE AND ELECTRICAL PROSPECTING SIGNAL TRANSMISSION METHOD USING SAME

CROSS-REFERENCE TO RELATED APPLICATIONS

This application is a continuation of International Patent Application No. PCT/CN2021/084286, filed on Mar. 31, 2021, which claims the benefit of priority from Chinese Patent Application No. 202010242180.X, filed on Mar. 31, 2020. The content of the aforementioned application, including any intervening amendments thereto, is incorporated herein by reference in its entirety.

TECHNICAL FIELD

This application relates to electrical prospecting, and more specifically to an electrical prospecting signal transmission device capable of suppressing electromagnetic coupling interference and an electrical prospecting signal transmission method using the same.

BACKGROUND

The controlled-source electrical prospecting generally suffers electromagnetic coupling interference, especially for the frequency-domain induced polarization method.

The frequency-domain induced polarization method is commonly used for mineral resource assessment and prospecting, and usually adopts a frequency of 0.01-10 Hz. The frequency-domain induced polarization method has advantages of strong anti-interference ability, light operation equipment and simple operations without terrain correction, and thus has been popularized. The electromagnetic coupling interference is caused by inductive coupling and capacitive coupling between a transmitter output circuit and a receiver input circuit, and its strength is mainly determined by the inductive coupling. An impact of the electromagnetic coupling interference will be strengthened with a decrease of underground resistivity and an increase of the frequency and pole distance. The electromagnetic coupling interference will directly affect measured values of induced polarization (IP) amplitude and frequency, and thus is a strong interference factor objectively existing in the application of the frequency-domain induced polarization method.

Currently, the electromagnetic coupling interference is often corrected by data processing. However, such method merely works well under a weak electromagnetic coupling, and fails to provide a desirable correction effect when the electromagnetic coupling interference is strong. Therefore, the data processing is not suitable for the field prospecting under complex geological conditions. In terms of the hardware-based direct decoupling, Chinese patent application No. 200710035797.9, titled "Global positioning system (GPS)-based precise synchronizing chop-wave decoupler for a frequency-domain electrical prospecting instrument", provides a synchronizing chop-wave decoupling method for eliminating electromagnetic coupling interference with respect to a signal received by an observation system to, which shows excellent decoupling performance. However, the wave copping may introduce a measurement error, and the transmitter and the receiver need to be strictly synchronized.

SUMMARY

In order to solve the above technical problems, the present disclosure provides an electrical prospecting signal transmission device capable of suppressing electromagnetic coupling interference and an electrical prospecting signal transmission method using the same.

The technical solutions of the present disclosure are described as follows.

In a first aspect, this application provides an electrical prospecting signal transmission device capable of suppressing electromagnetic coupling interference, comprising:
  a rectangular wave signal source;
  an output circuit for supplying power to ground; and
  a plurality of transmission channels;
  wherein each of the plurality of transmission channels comprises an isolated driving circuit, a low-pass filter circuit and a power amplification circuit connected sequentially in series; the rectangular wave signal source is configured to generate a rectangular wave or a composite rectangular wave; a signal output terminal of the rectangular wave signal source is connected to an input terminal of the isolated driving circuit of each of the plurality of transmission channels; and an output terminal of the power amplification circuit of each of the plurality of transmission channels is connected to the output circuit to supply power to the ground.

In an embodiment, the isolated driving circuit comprises a first resistor, a second resistor, an optocoupler, a first field effect transistor and a second field effect transistor; one end of the first resistor is configured as the input terminal of the isolated driving circuit, and is connected to the signal output terminal of the rectangular wave signal source; the other end of the first resistor is connected to a first pin of the optocoupler; a second pin of the optocoupler is connected to the ground; a third pin of the optocoupler and a source of the second field effect transistor are connected to a reference negative power supply VEE of a corresponding transmission channel of the plurality of transmission channels; a fourth pin of the optocoupler is connected to one end of the second resistor, a gate of the first field effect transistor and a gate of the second field effect transistor; the other end of the second resistor and a source of the first field effect transistor are connected to a reference power supply VCC; and a drain electrode of the first field effect transistor is connected to a drain electrode of the second field effect transistor, and is configured as an output terminal of the isolated driving circuit.

In an embodiment, the first field effect transistor is a P-channel enhancement-mode field effect transistor, and the second field effect transistor is an N-channel enhancement-mode field effect transistor.

In an embodiment, the low-pass filter circuit comprises a capacitor and a first switch; one end of the first switch is configured as an input terminal of the low-pass filter circuit, and is connected to the output terminal of the isolated driving circuit; the other end of the first switch is connected to one end of the capacitor, and is configured as an output terminal of the low-pass filter circuit; the other end of the capacitor is connected to the ground; both ends of the first switch are connected in parallel with a plurality of branches; and each of the plurality of branches comprises a third resistor and a second switch connected in series.

In an embodiment, low-pass filter circuits of the plurality of transmission channels have the same time constant, and the time constant is set to 0-40 ms.

In an embodiment, the rectangular wave signal source is a single-chip microcomputer, a complex programmable logic device (CPLD), a field programmable gate array (FPGA), a digital signal processor (DSP), a direct digital synthesizer (DDS) or a sequential logic circuit.

In an embodiment, output terminals of power amplification circuits of the plurality of transmission channels are separately connected to the output circuit, or are connected in series and then connected to the output circuit, so as to supply power to the ground.

In a second aspect, this application provides an electrical prospecting signal transmission method using the above device, comprising:

(S1) generating, by the rectangular wave signal source, a rectangular wave signal or a composite rectangular wave signal; and sending the rectangular wave signal or the composite rectangular wave signal to the plurality of transmission channels;

(S2) in each of the plurality of transmission channels, electrically isolating, by the isolated driving circuit, the rectangular wave signal or the composite rectangular wave signal; and outputting an isolated rectangular wave signal or an isolated composite rectangular wave signal;

(S3) filtering, by the low-pass filter circuit, the isolated rectangular wave signal or the isolated composite rectangular wave signal output by the isolated driving circuit; and outputting a filtered rectangular wave signal or a filtered composite rectangular wave signal;

(S4) amplifying, by the power amplification circuit, the filtered rectangular wave signal or the filtered composite rectangular wave signal output by the low-pass filter circuit; and outputting an amplified rectangular wave signal or an amplified composite rectangular wave signal; and (S5) allowing amplified rectangular wave signals or amplified composite rectangular wave signals output by power amplification circuits of the plurality of transmission channels to pass through the output circuit to separately power the ground or to be connected in series to power the ground.

In an embodiment, in step (S3), the number of branches connected to the low-pass filter circuit is adjusted by switching on-off second switches in the low-pass filter circuit, so as to change a time constant of the low-pass filter circuit.

Compared to the prior art, the present disclosure has the following beneficial effects.

1. The electrical prospecting signal transmission device provided herein includes a low-pass filter circuit, in which the number of branches connected can be changed by switching on-off of switches in the low-pass filter circuit, so as to change a time constant of the low-pass filter circuit to adjust an edge rate of an output waveform and suppress a high-order component in an output waveform of a transmission circuit, significantly reducing the inductive coupling interference of the transmission circuit current to a receiver input circuit and suppressing the influence of the electromagnetic coupling interference on measurement data received by the receiver.

2. The edge rate of the output waveform of the transmission device provided herein can be adjusted by switching the time constant of the low-pass filter circuit according to the actual requirements of field work, and the output waveform of the device is not vulnerable to the grounding conditions, rendering the device easy to operate.

3. When the device provided herein needs a high output voltage, output terminals of any number of transmission channels are cascaded (connected in series) to output to a higher voltage.

4. A resistance capacitance (RC) low-pass filter circuit is introduced to directly reduce the edge rate of the rectangular wave, perform high-fidelity power amplification and supply power to the ground, significantly reducing the electromagnetic coupling interference generated by an electrical prospecting signal transmission circuit and improving a signal-to-noise ratio of the received signal and the quality of the received data. The application is suitable for the electrical prospecting signal transmission, particularly for the frequency-domain induced polarization to suppress the influence of the electromagnetic coupling interference on the measurement of the induced polarization signal.

DETAILED DESCRIPTION OF EMBODIMENTS

The disclosure will be further described below in detail with reference to the accompanying drawings and embodiments.

Figure 1:
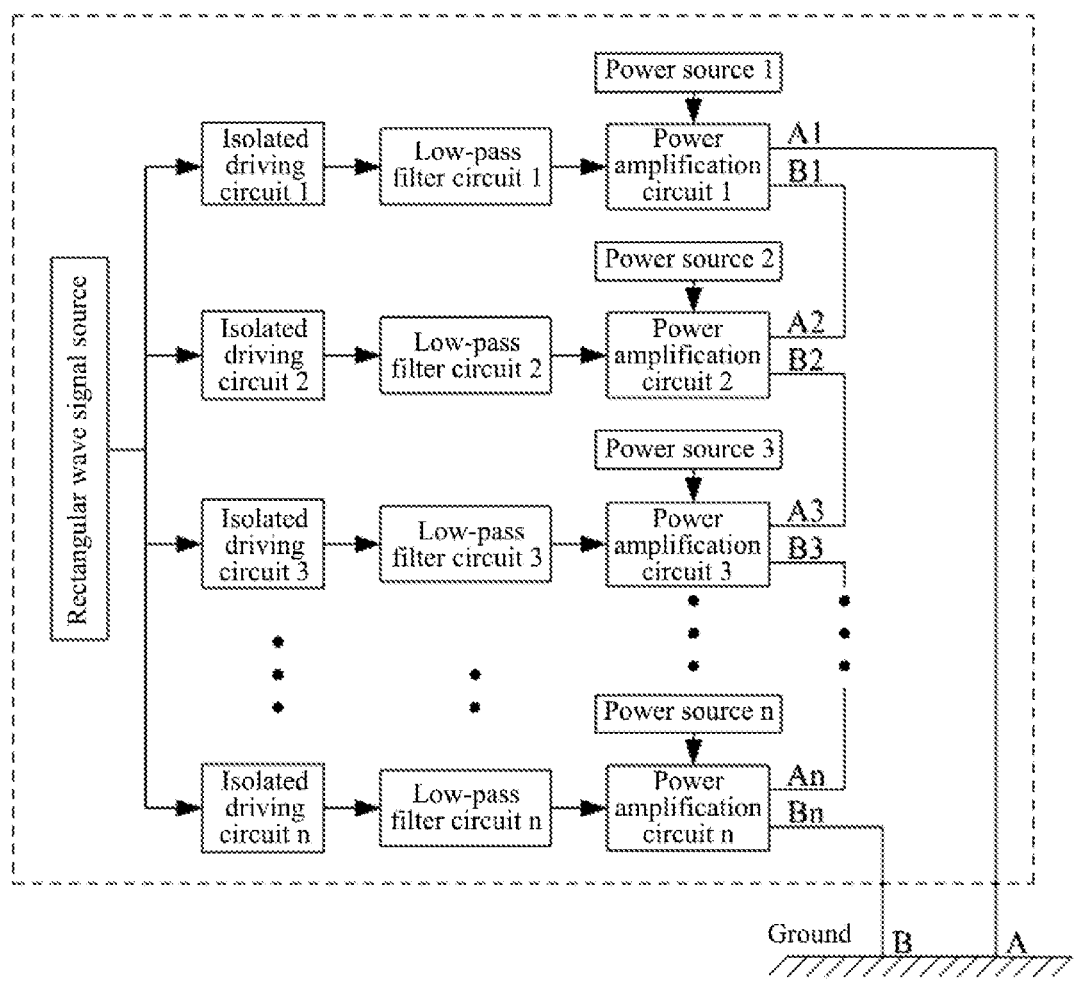
FIG. 1 is a structural block diagram of an electrical prospecting signal transmission device according to an embodiment of the present disclosure.

As shown in FIG. 1, an electrical prospecting signal transmission device capable of suppressing electromagnetic coupling interference is provided, which includes a rectangular wave signal source, an output circuit for supplying power to ground and a plurality of transmission channels. Each of the plurality of transmission channels includes an isolated driving circuit, a low-pass filter circuit and a power amplification circuit connected sequentially in series. A first transmission channel includes a first isolated driving circuit, a first low-pass filter circuit and a first power amplification circuit; a second transmission channel includes a second isolated driving circuit, a second low-pass filter circuit and a second power amplification circuit; a third transmission channel includes a third isolated driving circuit, a third low-pass filter circuit and a third power amplification circuit; . . . and an $n^{th}$ transmission channel includes an $n^{th}$ isolated driving circuit, an $n^{th}$ low-pass filter circuit and an $n^{th}$ power amplification circuit. The rectangular wave signal source is configured to generate a rectangular wave or a composite rectangular wave. A signal output terminal of the rectangular wave signal source is connected to an input terminal of the isolated driving circuit of each of the plurality of transmission channels. Output terminals of the power amplification circuits of the transmission channels are separately connected to the output circuit, or connected in series (cascade) and then connected to the output circuit, so as to supply power to the ground.

The rectangular wave signal source is generally a single-chip microcomputer to generate a rectangular wave signal or a composite rectangular wave signal. In some embodiments, the rectangular wave signal source is a complex programmable logic device (CPLD), a field programmable gate array (FPGA), a digital signal processor (DSP), a direct digital synthesizer (DDS) or a sequential logic circuit.

Figure 2:
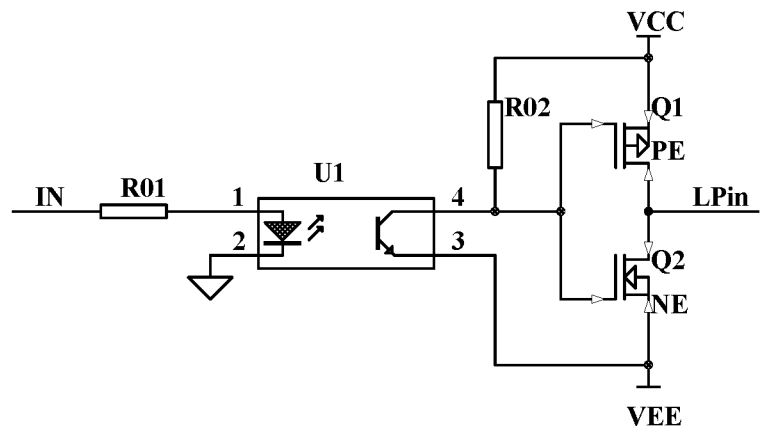
FIG. 2 is a schematic diagram of an isolated driving circuit in FIG. 1.

The isolated driving circuit is an optocoupler, an optical fiber isolator, an isolation drive chip or an isolation drive module to achieve isolation drive. As shown in FIG. 2, the isolated driving circuit includes a first resistor R01, a second resistor R02, an optocoupler U1, a first field effect transistor Q1 and a second field effect transistor Q2. The first field effect transistor Q1 is a P-channel enhancement-mode field effect transistor, and the second field effect transistor Q2 is an N-channel enhancement-mode field effect transistor. One end of the first resistor R01 is configured as an input terminal IN of the isolated driving circuit, and is connected to an output terminal of the rectangular wave signal source. The other end of the first resistor R01 is connected to a first pin of the optocoupler U1. A second pin of the optocoupler U1 is connected to the ground. A third pin of the optocoupler U1 and a source of the second field effect transistor Q2 are connected to a reference negative power supply VEE of a corresponding transmission channel of the plurality of transmission channels. A fourth pin of the optocoupler U1 is connected to one end of the second resistor R02, a gate of the first field effect transistor Q1 and a gate of the second field effect transistor Q2. The other end of the second resistor R02 and a source of the first field effect transistor Q1 are connected to a reference power supply VCC. A drain electrode of the first field effect transistor Q1 is connected to a drain electrode of the second field effect transistor Q2, and is configured as an output terminal of the isolated driving circuit.

As shown in FIG. 2, the rectangular wave or the compound rectangular wave generated by the rectangular wave signal source is input by the first pin of the optocoupler U1, and output by the fourth pin of the optocoupler U1. When the rectangular wave signal source outputs a high level, a light-emitting diode (LED) inside the optocoupler U1 emits a light; a phototransistor inside the optocoupler U1 is under saturated conduction; the fourth pin of the optocoupler U1 outputs a low level; the first field effect transistor Q1 is conducted; the second field effect transistor Q2 is cut off; and a LPin terminal outputs a high level VCC. When the rectangular wave signal source outputs a low level, the LED inside the optocoupler U1 emits a light; the phototransistor inside the optocoupler U1 is cut off; the fourth pin of the optocoupler U1 outputs a high level; the first field effect transistor Q1 is cut off; the second field effect transistor Q2 is conducted; and the LPin terminal outputs a low-level VEE. The isolated driving circuit performs an electrical isolation between the rectangular wave signal source and an optocoupler U1 post-stage circuit, and keeps the rectangular wave signal within a range of VEE-VCC (The high level VCC and the VCC are a high-precision positive power supply with an equal value, and the low-level VEE and the VEE are a high-precision negative power supply with an equal value).

Figure 3:
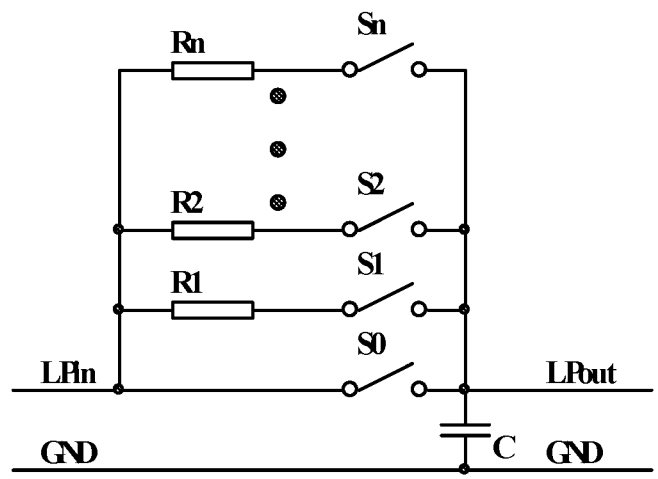
FIG. 3 is a schematic diagram of a low-pass filter circuit in FIG. 1.

The low-pass filter circuit is a resistance capacitance (RC) low-pass filter circuit with a fixed time constant or an adjustable time constant. As shown in FIG. 3, the low-pass filter circuit includes a capacitor C and a resistor connected in series. The resistor is arbitrarily switchable. The capacitor C and the resistor constitute the RC low-pass filter circuit. A low-pass filtered signal is output by an upper terminal of the capacitor C, that is, an LPout terminal. The output terminal of the isolated driving circuit is connected to an LPin terminal of the low-pass filter circuit. The LPin terminal is connected to a left end of the switch S0, a left end of the resistor R1, a left end of the resistor R2, . . . , and a left end of the resistor Rn. A right end of the resistor R1 is connected with a left end of the switch S1; a right end of the resistor R2 is connected to a left end of the switch S2, . . . , and a right end of the resistor Rn is connected to a left end of the switch Sn. A lower end of the capacitor C is connected to the ground. The low-pass filtered signal is output from an upper end of the capacitor, that is, the LPout terminal, to an input terminal of the power amplification circuit.

When applying the frequency-domain induced polarization method, a frequency of the rectangular wave signal is usually set to 0.01-10 Hz; the time constant is set to 0-40 ms. The time constant is adjustable or switchable between different levels. Low-pass filter circuits of the plurality of transmission channels have the same time constant.

The power amplification circuit is a high-fidelity digital power amplification circuit, that is, a simulation power amplification circuit or a digital power amplification circuit, which has a high power-conversion efficiency, and is light and reliable. A gain of an amplifier is multi-level optional or a fixed to ensure an accuracy of the gain and a stability of an output level. Output terminals of the power amplification circuit of the plurality of transmission channels are separately connected to the output circuit to supply a current to the ground, or are cascaded (connected in series) and then connected to the output circuit to supply a higher output voltage to the ground; or the output terminals are connected in parallel to supply a greater output current for a region with a very low grounding resistance.

An electrical prospecting signal transmission method using the above device is also provided, which includes the following steps.

(S1) A rectangular wave signal or a composite rectangular wave signal is generated by the rectangular wave signal source, and then sent to the plurality of transmission channels.

(S2) In each of the plurality of transmission channels, the rectangular wave signal or the composite rectangular wave signal is electrically isolated by the isolated driving circuit, and an isolated rectangular wave signal or an isolated composite rectangular wave signal is output.

(S3) The isolated rectangular wave signal or the isolated composite rectangular wave signal output by the isolated driving circuit is filtered by a low-pass filter circuit, and a filtered rectangular wave signal or a filtered composite rectangular wave signal is output. The number of branches connected to the low-pass filter circuit is adjusted through turning on or off a branch switch in the low-pass filter circuit, so as to change a time constant of the low-pass filter circuit.

(S4) The filtered rectangular wave signal or the filtered composite rectangular wave signal output by the low-pass filter circuit is amplified by the power amplification circuit, and an amplified rectangular wave signal or an amplified composite rectangular wave signal is output.

(S5) Amplified rectangular wave signals or amplified composite rectangular wave signals output by power amplification circuits of the plurality of transmission channels are allowed to pass through the output circuit to separately power the ground or to be connected in series to power the ground.

An output signal of the electrical prospecting signal transmission device provided herein is sampled and sent to a receiver for calibration as a calibration signal, and the calibrated receiver is capable of carrying out an actual measurement. After a low-pass filter time constant of a sending terminal is switched, the receiver needs to be online with the device provided herein for calibration and then carries out the actual measurement. The receiver may also be pre-calibrated online with the device according to low-pass filter time constants of a sent waveform one by one, and when in use, the actual measurement can be performed if the low-pass filter time constant of the device is consistent with a corresponding calibration position of the receiver.

Figure 4:
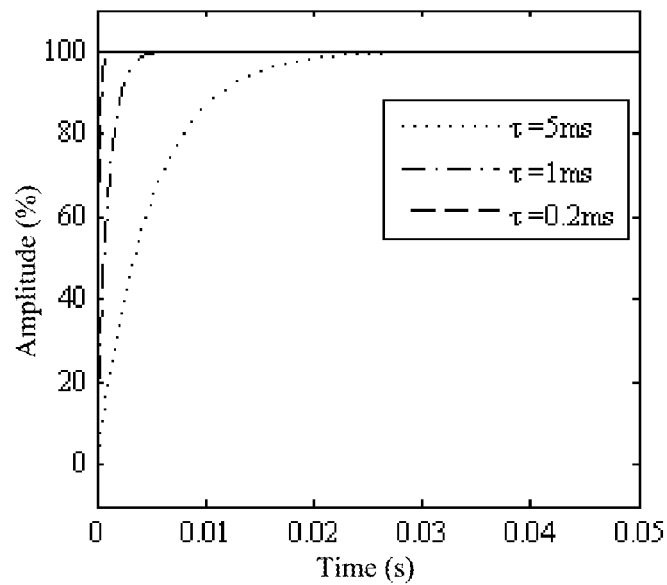
FIG. 4 is a simulation diagram of a rising edge waveform of a rectangular wave according to an embodiment of the present disclosure.
Figure 5:
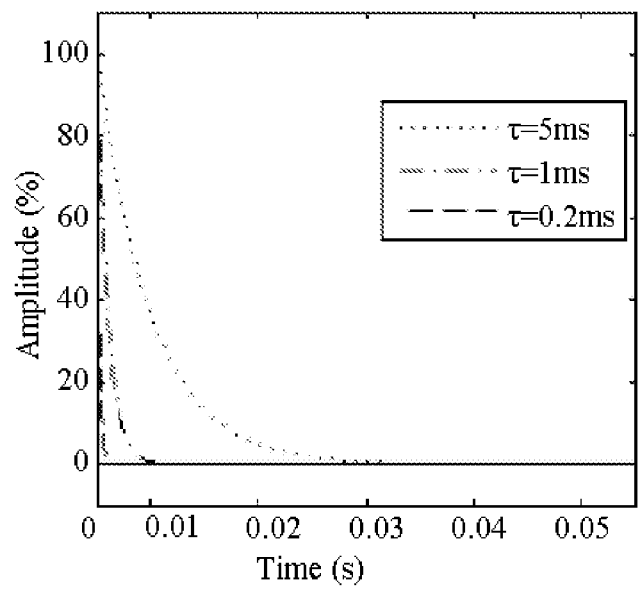
FIG. 5 is a simulation diagram of a falling edge waveform of the rectangular wave according to an embodiment of the present disclosure.

FIGS. 4-5 show simulation diagrams of edge low-pass filters of the rectangular wave. An edge rate of the rectangular wave is changed by switching of the low-pass filter time constant. The rectangular wave is power amplified and output to supply power to the ground, which can greatly reduce the electromagnetic coupling interference caused by a sending terminal of the electrical prospecting signal.

Figure 6:
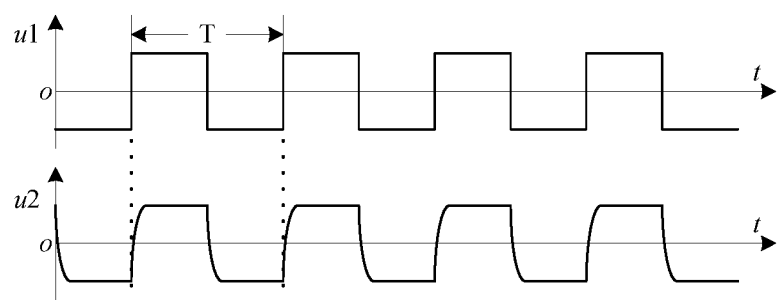
FIG. 6 schematically depicts an output waveform of the rectangular wave after passing through the isolated driving circuit and the low-pass filter circuit according to an embodiment of the present disclosure.
Figure 7:
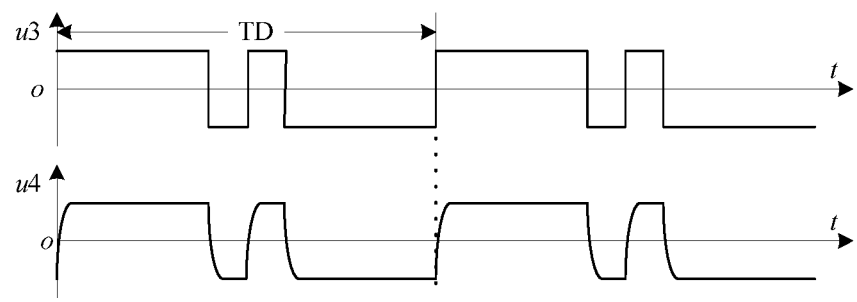
FIG. 7 schematically depicts of an output waveform of a composite rectangular wave after passing through the isolated driving circuit and the low-pass filter circuit according to an embodiment of the present disclosure.

FIGS. 6-7 schematically depict waveforms of some test points of the device provided herein when the device sends the rectangular wave signal or the composite rectangular wave signal. FIG. 6 shows the waveform when the rectangular wave is sent. A waveform u1 schematically depicts an output waveform of the rectangular wave signal source after passing through the isolated driving circuit. A waveform u2 is an output waveform of the waveform u1 after being low-pass filtered. After being subjected to a high efficiency and fidelity amplify by the power amplification circuit, the waveform u2 supplies power to the ground, or power amplifier output terminals of the plurality of signal transmission channels are cascaded (connected in series) to output a rectangular wave signal with a higher voltage to supply power to the ground. FIG. 7 shows the waveform when the composite rectangular wave is sent. A waveform u3 schematically depicts an output waveform of the rectangular wave signal source after passing through the isolated driving circuit. A waveform u4 schematically depicts an output waveform of the waveform u3 after being low-pass filtered. After being subjected to a high efficiency and fidelity amplify by a post-stage power amplification circuit, the waveform u4 supplies power to the ground, or the power amplifier output terminals of the plurality of signal transmission channels are cascaded (connected in series) to output a composite rectangular wave signal with a higher voltage to supply power to the ground.

What is claimed is:

1. An electrical prospecting signal transmission device capable of suppressing electromagnetic coupling interference, comprising:
    a rectangular wave signal source;
    an output circuit for supplying power to ground; and
    a plurality of transmission channels;
    wherein each of the plurality of transmission channels comprises an isolated driving circuit, a low-pass filter circuit and a power amplification circuit sequentially connected in series; the rectangular wave signal source is configured to generate a rectangular wave or a composite rectangular wave; a signal output terminal of the rectangular wave signal source is connected to an input terminal of the isolated driving circuit of each of the plurality of transmission channels; and an output terminal of the power amplification circuit of each of the plurality of transmission channels is connected to the output circuit to supply power to the ground.

2. The electrical prospecting signal transmission device of claim 1, wherein the isolated driving circuit comprises a first resistor, a second resistor, an optocoupler, a first field effect transistor and a second field effect transistor; one end of the first resistor is configured as the input terminal of the isolated driving circuit, and is connected to the output terminal of the rectangular wave signal source; the other end of the first resistor is connected to a first pin of the optocoupler; a second pin of the optocoupler is connected to the ground; a third pin of the optocoupler and a source of the second field effect transistor are connected to a corresponding reference negative power supply VEE of a corresponding transmission channel of the plurality of transmission channels; a fourth pin of the optocoupler is connected to one end of the second resistor, a gate of the first field effect transistor and a gate of the second field effect transistor; the other end of the second resistor and a source of the first field effect transistor are connected to a reference power supply VCC; and a drain electrode of the first field effect transistor is connected to a drain electrode of the second field effect transistor and is configured as an output terminal of the isolated driving circuit.

3. The electrical prospecting signal transmission device of claim 2, wherein the first field effect transistor is a P-channel enhancement-mode field effect transistor, and the second field effect transistor is an N-channel enhancement-mode field effect transistor.

4. The electrical prospecting signal transmission device of claim 2, wherein the low-pass filter circuit comprises a capacitor and a first switch; one end of the first switch is configured as an input terminal of the low-pass filter circuit, and is connected to the output terminal of the isolated driving circuit; the other end of the first switch is connected to one end of the capacitor, and is configured as an output terminal of the low-pass filter circuit; the other end of the capacitor is connected to the ground; both ends of the first switch are connected in parallel with a plurality of branches; and each of the plurality of branches comprises a third resistor and a second switch connected in series.

5. The electrical prospecting signal transmission device of claim 4, wherein low-pass filter circuits of the plurality of transmission channels have the same time constant, and the time constant is set to 0-40 ms.

6. The electrical prospecting signal transmission device of claim 1, wherein the rectangular wave signal source is a single-chip microcomputer, a complex programmable logic device (CPLD), a field programmable gate array (FPGA), a digital signal processor (DSP), a direct digital synthesizer (DDS) or a sequential logic circuit.

7. The electrical prospecting signal transmission device of claim 1, wherein output terminals of power amplification circuits of the plurality of transmission channels are separately connected to the output circuit, or are connected in series and then connected to the output circuit, so as to supply power to the ground.

8. An electrical prospecting signal transmission method using the electrical prospecting signal transmission device of claim 1, comprising:
    (S1) generating, by the rectangular wave signal source, a rectangular wave signal or a composite rectangular wave signal; and sending the rectangular wave signal or the composite rectangular wave signal to the plurality of transmission channels;

(S2) in each of the plurality of transmission channels, electrically isolating, by the isolated driving circuit, the rectangular wave signal or the composite rectangular wave signal; and outputting an isolated rectangular wave signal or an isolated composite rectangular wave signal;

(S3) filtering, by the low-pass filter circuit, the isolated rectangular wave signal or the isolated composite rectangular wave signal output by the isolated driving circuit; and outputting a filtered rectangular wave signal or a filtered composite rectangular wave signal;

(S4) amplifying, by the power amplification circuit, the filtered rectangular wave signal or the filtered composite rectangular wave signal output by the low-pass filter circuit; and outputting an amplified rectangular wave signal or an amplified composite rectangular wave signal; and (S5) allowing amplified rectangular wave signals or amplified composite rectangular wave signals output by power amplification circuits of the plurality of transmission channels to pass through the output circuit to separately power the ground or to be connected in series to power the ground.

9. The electrical prospecting signal transmission method of claim 8, wherein in step (S3), the number of branches connected to the low-pass filter circuit is adjusted by switching on-off second switches in the low-pass filter circuit, so as to change a time constant of the low-pass filter circuit.

* * * * *